(12) United States Patent
Iwafuchi et al.

(10) Patent No.: US 9,018,728 B2
(45) Date of Patent: Apr. 28, 2015

(54) SEMICONDUCTOR APPARATUS, MANUFACTURING APPARATUS, AND MANUFACTURING METHOD

(75) Inventors: Toshiaki Iwafuchi, Kanagawa (JP); Masahiko Shimizu, Kanagawa (JP)

(73) Assignee: Sony Corporation, Tokyo (JP)

( * ) Notice: Subject to any disclaimer, the term of this patent is extended or adjusted under 35 U.S.C. 154(b) by 642 days.

(21) Appl. No.: 13/352,776

(22) Filed: Jan. 18, 2012

(65) Prior Publication Data
US 2012/0211855 A1 Aug. 23, 2012

(30) Foreign Application Priority Data
Feb. 18, 2011 (JP) .................................. 2011-033688

(51) Int. Cl.
| | | |
|---|---|---|
| H01L 31/058 | (2006.01) | |
| H01L 27/146 | (2006.01) | |
| H01L 23/00 | (2006.01) | |

(52) U.S. Cl.
CPC .... *H01L 27/14618* (2013.01); *H01L 27/14623* (2013.01); *H01L 24/48* (2013.01); *H01L 24/78* (2013.01); *H01L 24/85* (2013.01); *H01L 24/97* (2013.01); *H01L 2224/48091* (2013.01); *H01L 2224/48465* (2013.01); *H01L 2224/78301* (2013.01); *H01L 2224/85181* (2013.01); *H01L 2924/19105* (2013.01); *H01L 2224/451* (2013.01); *H01L 2224/97* (2013.01); *H01L 2924/3025* (2013.01)

(58) Field of Classification Search
None
See application file for complete search history.

(56) References Cited

U.S. PATENT DOCUMENTS

| | | | |
|---|---|---|---|
| 8,786,041 B2* | 7/2014 | Iwafuchi et al. | 257/435 |
| 2012/0211853 A1* | 8/2012 | Shimizu et al. | 257/436 |
| 2014/0306310 A1* | 10/2014 | Iwafuchi et al. | 257/432 |

FOREIGN PATENT DOCUMENTS

JP 2006-13979 1/2006

* cited by examiner

*Primary Examiner* — Jack Chen
(74) *Attorney, Agent, or Firm* — Oblon, McClelland, Maier & Neustadt, L.L.P.

(57) ABSTRACT

A semiconductor apparatus includes: a first sheet-like member having a light receiving surface of an imaging device and a first connection terminal disposed thereon, the imaging device generating an image by receiving incident light from a light collecting section for collecting external light disposed thereon; a second sheet-like member having a second connection terminal to be connected to the first connection terminal provided thereon; a conductive bonding portion made of a conductive material and bonded with the first connection terminal; and a bonding wire connecting the conductive bonding portion and the second connection terminal, wherein the bonding wire is disposed along the plane of the first sheet-like member such that reflected light from the bonding wire does not impinge on the light receiving surface.

5 Claims, 12 Drawing Sheets

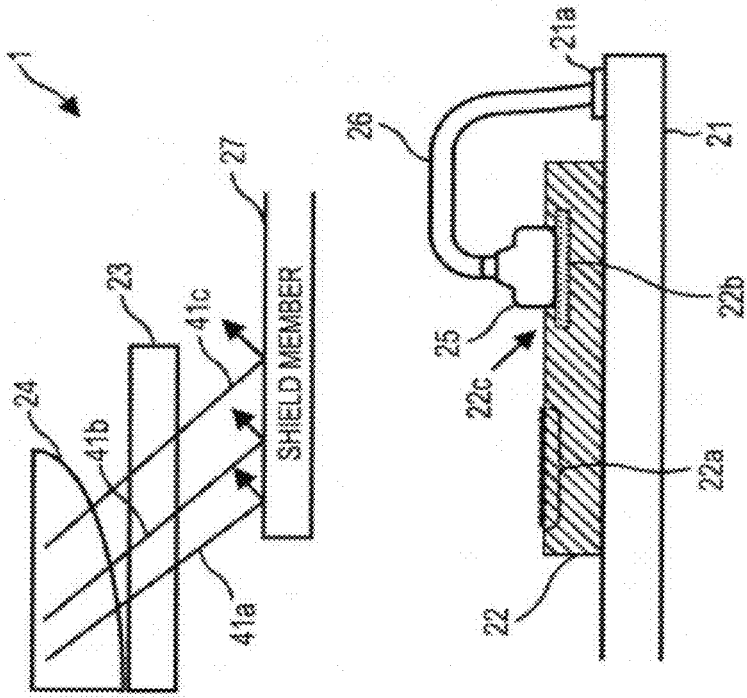
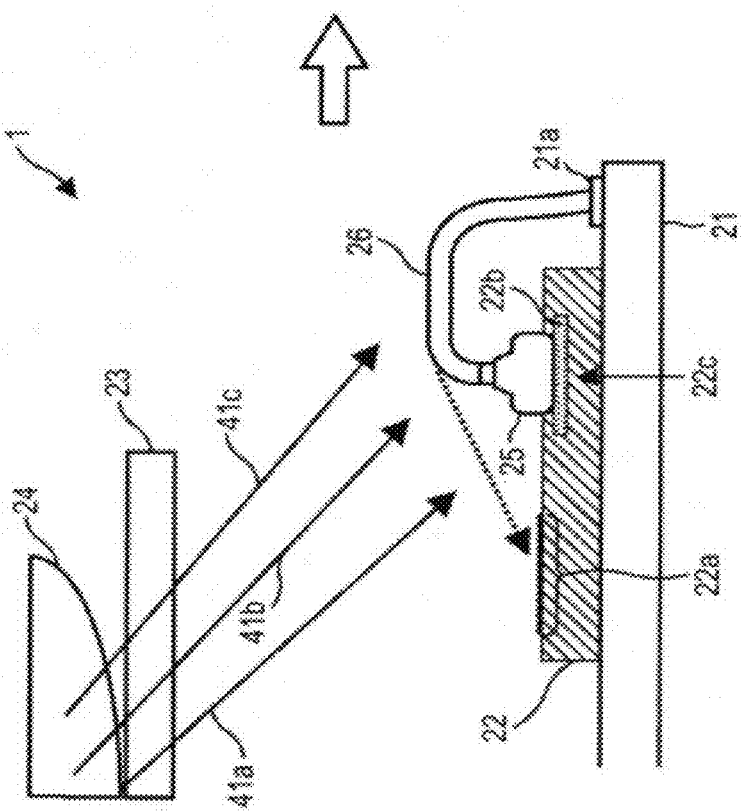
FIG. 1A
FIG. 1B

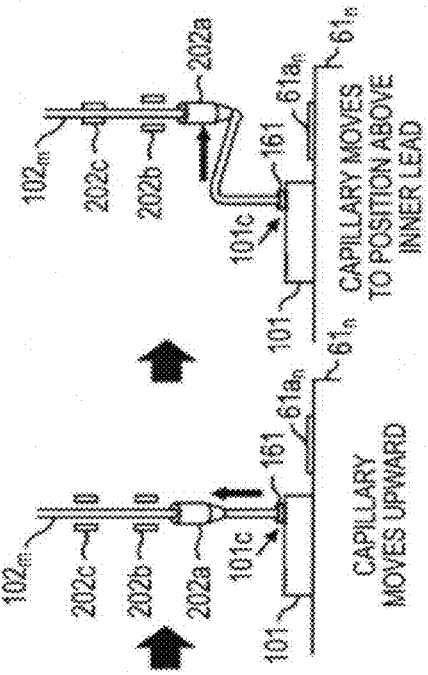
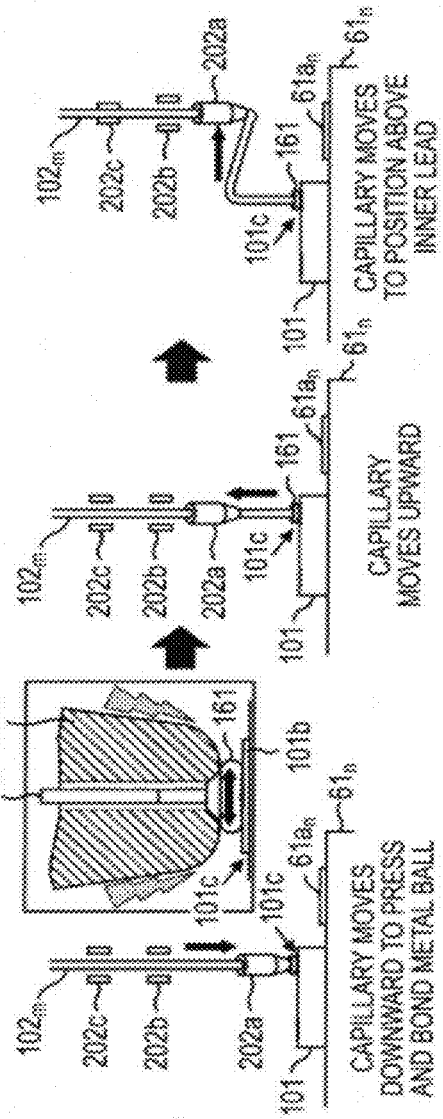
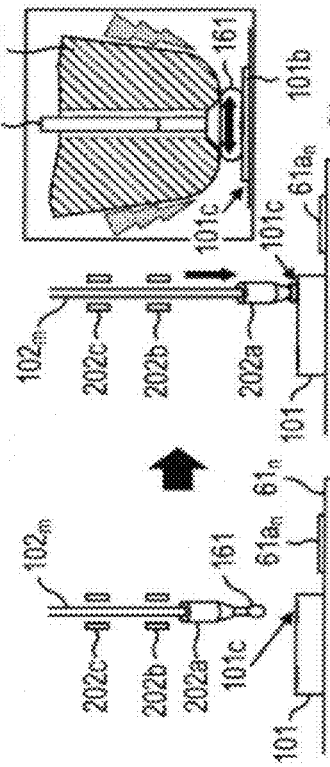
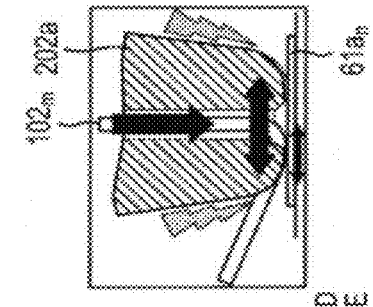
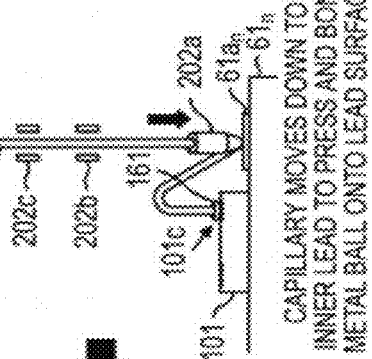
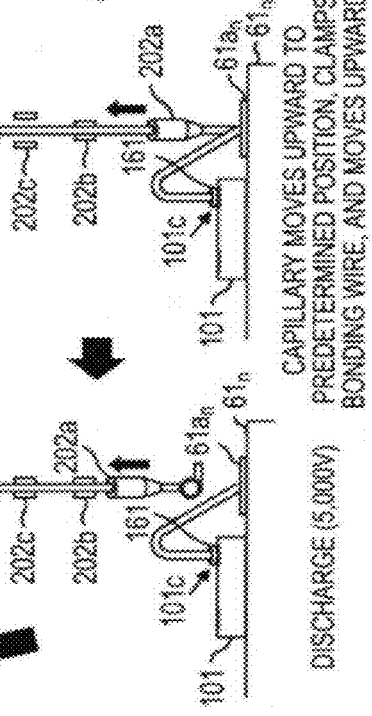

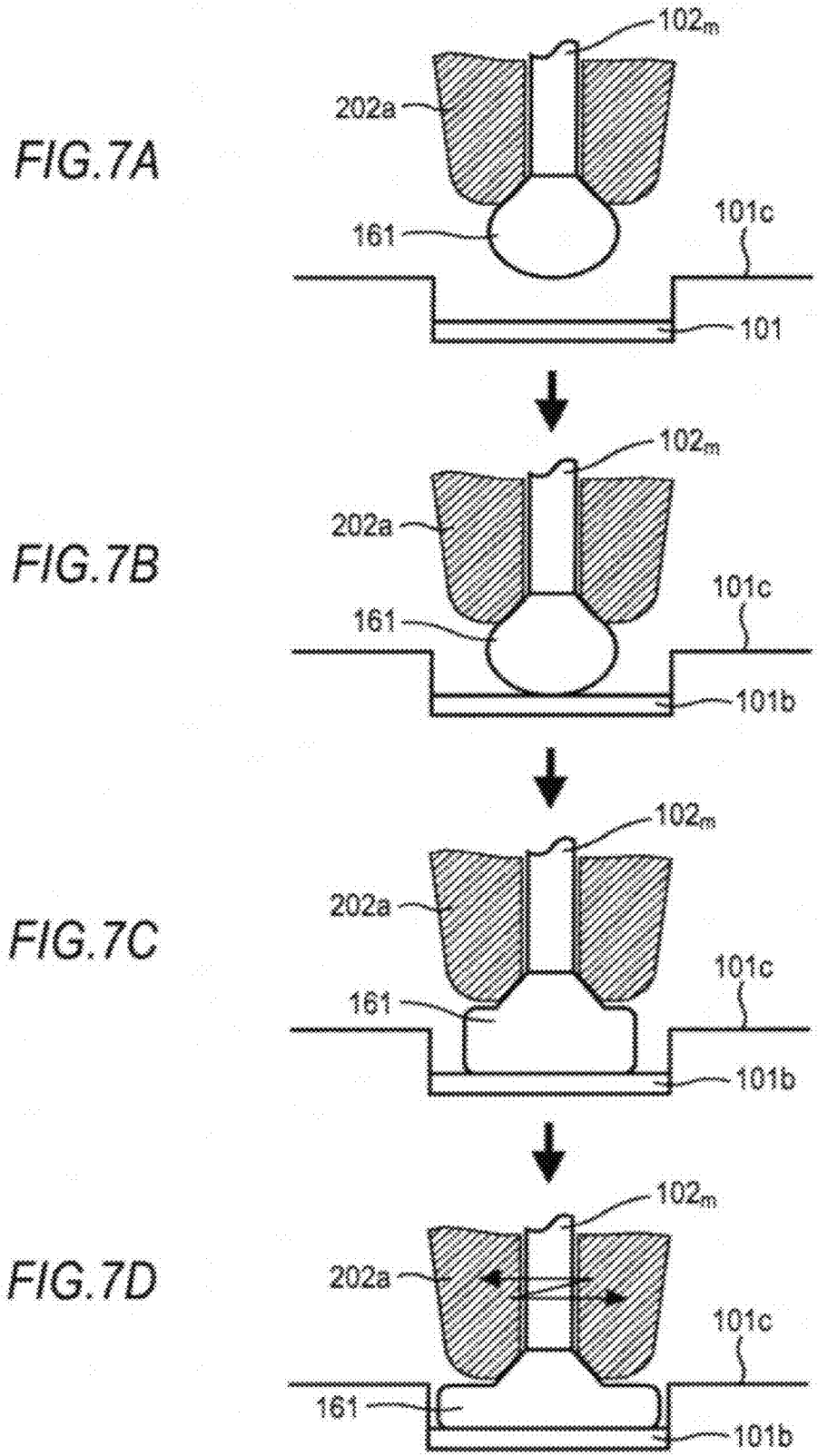

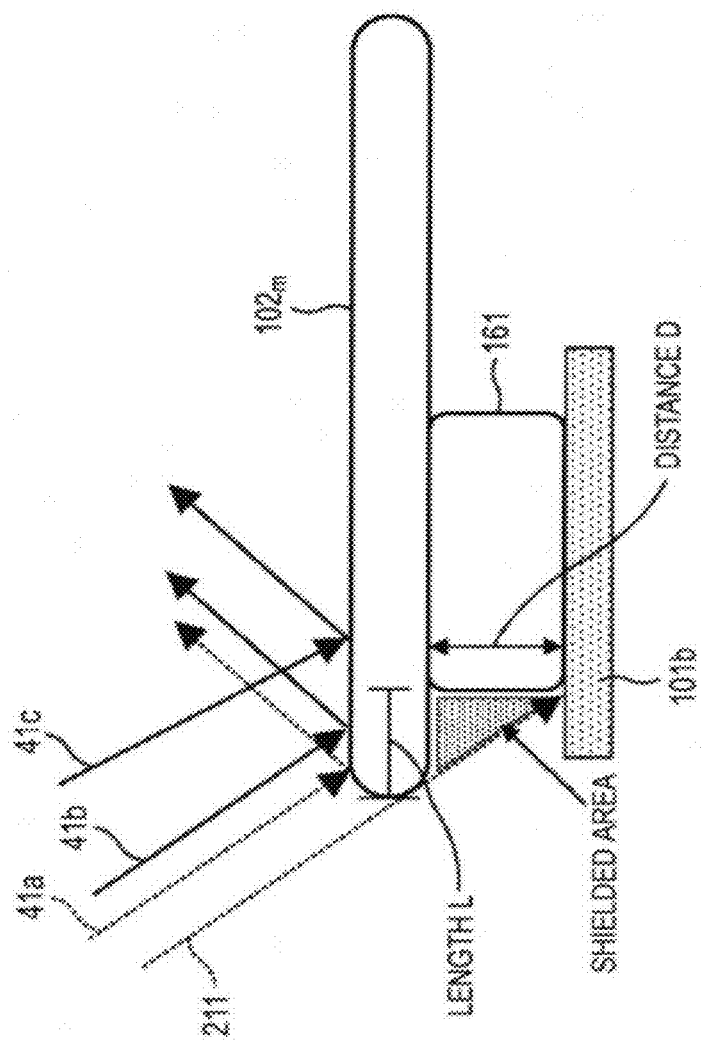
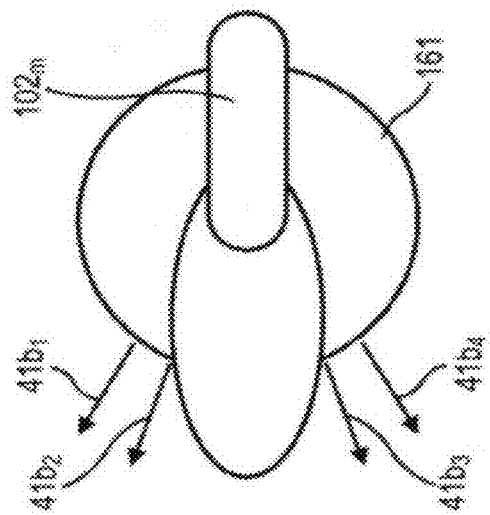
FIG.10A
FIG.10B

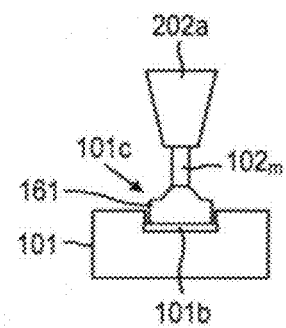 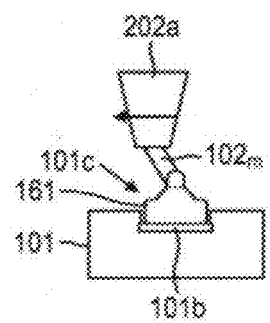 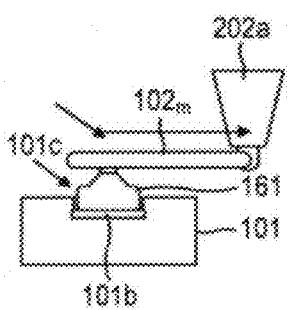
FIG.11A  FIG.11B  FIG.11C
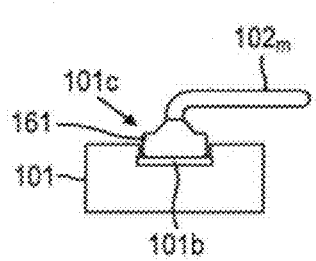 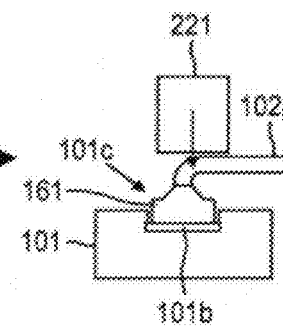 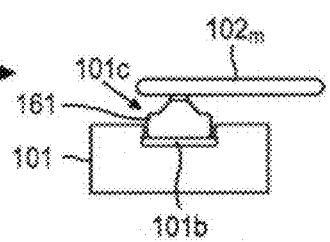
FIG.12A  FIG.12B  FIG.12C
FIG.13
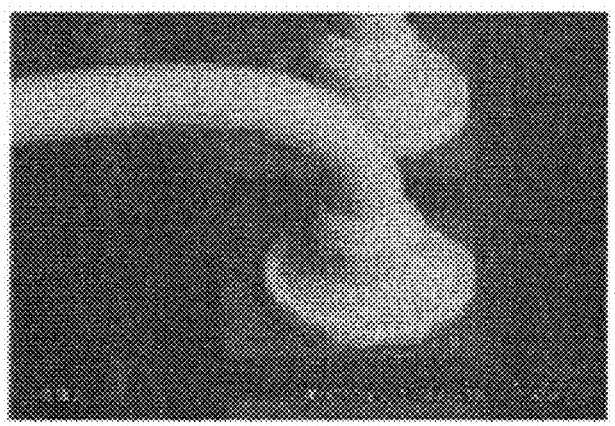

SEMICONDUCTOR APPARATUS, MANUFACTURING APPARATUS, AND MANUFACTURING METHOD

FIELD

The present disclosure relates to a semiconductor apparatus and an apparatus and a method for manufacturing the semiconductor apparatus. More particularly, the present disclosure relates to a semiconductor apparatus in which degradation of image quality attributable to, for example, reflected light from wirings provided in the vicinity of an imaging device is suppressed, and the present disclosure also relates to an apparatus and a method for manufacturing such a semiconductor apparatus.

BACKGROUND

For example, there is a semiconductor apparatus 1 which serves as a camera module for imaging an object by photoelectrically converting light coming from outside, as shown in FIG. 1A. The semiconductor apparatus 1 is primarily formed by a printed substrate 21, an imaging chip 22, an infrared cutoff filter 23, and a lens 24.

In the semiconductor apparatus 1, electrode pads 22b provided in the vicinity of a light-receiving surface 22a of an imaging device (not shown) located on the imaging chip 22 are connected to inner leads 21a on the printed substrate 21 through metal wire bonding portion 25 and metal wires 26. The electrode pads 22b are disposed on the bottom of a recess 22c provided on the imaging chip 22.

The light-receiving surface 22a which receives light entering through the lens 24 and the infrared cutoff filter 23 has a rectangular shape. However, the light impinges on the imaging chip 22 in the form of a spot extending in a circular range in which the light-receiving surface 22a is included.

Therefore, when not only the light-receiving surface 22a but also the electrode pads 22b are provided within the circular range, for example, light beams 41a to 41c impinge on the metal wire bonding portions 25 which are pressed to be bonded with the electrode pads 22b and the metal wires 26 which are connected to the metal wire bonding portions 25.

As a result, the light-receiving surface 22a receives not only the light entering through the lens 24 and the infrared cutoff filter 23 but also reflected light beams, i.e., reflections of the light beams 41a to 41c impinging on the metal wire bonding portions 25 and the metal wires 26.

In this case, an image generated by the imaging chip 22 may have noises such as flare and ghosts attributable to the reception of the reflected light beams from the metal wire bonding portions 25 and the metal wires 26 at the light-receiving surface 22a of the imaging chip 22.

A first method which is generally used under such a circumstance to avoid the reception of reflected light beams from the metal wire bonding portions 25 and the metal wires 26 is to shield the metal wire bonding portions 25 and the metal wires 26 from the light beams 41a to 41c by providing a shield member 27 as shown in FIG. 1B.

There is a second proposed method in which the reflected light beams from the metal wire bonding portions 25 and the metal wires 26 are suppressed by disposing the electrode pads 22b of the imaging chip 22 apart from the light-receiving surface 22a (for example, see JP-A-2006-013979 (Patent Document 1)).

SUMMARY

According to the above-described first method, the shield member 27 must be accurately disposed in order to shield the metal wire bonding portions 25 and the metal wires 26 from light beams 41a to 41c with the light traveling toward the light-receiving surface 22a through the lens 24 and the infrared cutoff filter 23 from outside kept unblocked.

For example, when the shield member 27 is disposed in a position as shown in FIG. 1B, (a part of) the light which is to impinge on the light-receiving surface 22a may be blocked. On the contrary, when the position of the shield member 27 is offset, for example, rightward in the figure, the metal wire bonding portions 25 and the metal wires 26 may not be shielded from the light beams 41a to 41c.

According to the first method, the manufacture of the semiconductor apparatus 1 requires an additional process for providing the shield member 27, and the number of components required to form the semiconductor apparatus 1 increases. Thus, the manufacturing cost of the semiconductor apparatus 1 will become very high according to the first method.

Further, according to the first method the semiconductor apparatus 1 becomes undesirably large to accommodate the shield member 27.

According to the above-described second method, the electrode pads 22b of the imaging chip 22 are disposed apart from the light-receiving surface 22a. The approach makes the semiconductor apparatus 1 larger, for example, when compared to a configuration in which the electrode pads 22b are closer to the light-receiving surface 22a.

Under the circumstance, it is desirable to provide a smaller semiconductor apparatus while preventing degradation of the quality of an image obtained by the apparatus.

An embodiment of the present disclosure is directed to a semiconductor apparatus including: a first sheet-like member having a light receiving surface of an imaging device and a first connection terminal disposed thereon, the imaging device generating an image by receiving incident light from a light collecting section for collecting external light disposed thereon; a second sheet-like member having a second connection terminal to be connected to the first connection terminal provided thereon; a conductive bonding portion made of a conductive material and bonded with the first connection terminal; and a bonding wire connecting the conductive bonding portion and the second connection terminal. The bonding wire is disposed along the plane of the first sheet-like member such that reflected light from the bonding wire does not impinge on the light receiving surface.

The first connection terminal may be disposed on the bottom of a recess formed on the side of the first sheet-like member on which the light receiving surface is disposed and the conductive bonding portion may be pressed into a groove formed by the recess and bonded to the first connection terminal.

The bonding wire may be formed with a projecting part projecting from the conductive bonding portion toward the light receiving surface to shield the conductive bonding portion from incident light coming from the light collection section.

The projecting part of the bonding wire may be formed with a length determined based on the distance from the connection between the bonding wire and the conductive bonding portion to the first sheet-like member to shield the conductive bonding portion from incident light coming from the light collection section.

The conductive bonding portion may be either a stud bump or a metal ball formed by spherically shaping a tip part of the bonding wire.

According to the embodiment of the present disclosure, the bonding wire is disposed along the plane of the first sheet-like member such that reflected light from the bonding wire does not impinge on the light reflecting surface.

Another embodiment of the present disclosure is directed to a manufacturing apparatus for manufacturing a semiconductor, including: a bonding section for bonding a conductive bonding portion made of a conductive material with a first connection terminal provided on a first sheet-like member having light receiving surface of an imaging device and the first connection terminal disposed thereon, the imaging device generating an image by receiving incident light from a light collecting section for collecting external light; and a wire disposing section for disposing a bonding wire connected to the conductive bonding portion along the plane of the first sheet-like member such that reflected light from the bonding wire does not impinge on the light receiving surface.

The first connection terminal may be disposed on the bottom of a recess formed on the side of the first sheet-like member on which the light receiving surface is disposed and the bonding section may bond the conductive bonding portion with the first connection terminal by pressing it into a groove formed by the recess.

The wire disposing section may dispose the bonding wire and may form the bonding wire with a projecting part projecting from the conductive bonding portion toward the light receiving surface.

The wire disposing section may form the bonding wire with the projecting part such that the projecting part has a length determined based on the distance from the connection between the bonding wire and the conductive bonding portion to the first sheet-like member.

Still another embodiment of the present disclosure is directed to a manufacturing method executed by a manufacturing apparatus for manufacturing a semiconductor, including: bonding a conductive bonding portion made of a conductive material with a first connection terminal provided on a first sheet-like member having light receiving surface of an imaging device and the first connection terminal disposed thereon, the imaging device generating an image by receiving incident light from a light collecting section for collecting external light; and disposing a bonding wire connected to the conductive bonding portion along the plane of the first sheet-like member such that reflected light from the bonding wire does not impinge on the light receiving surface.

According to the embodiment of the present disclosure, a conductive bonding portion made of a conductive material is bonded with a first connection terminal provided on a first sheet-like member having light receiving surface of an imaging device and the first connection terminal disposed thereon, the imaging device generating an image by receiving incident light from a light collecting section for collecting external light. A bonding wire connected to the conductive bonding portion is disposed along the plane of the first sheet-like member such that reflected light from the bonding wire does not impinge on the light receiving surface.

According to the embodiment of the present disclosure, a semiconductor apparatus can be provided with a small size while suppressing degradation of quality of an image imaged by the apparatus.

According to the embodiment of the present disclosure, a small-sized semiconductor apparatus can be manufactured while suppressing degradation of quality of an image imaged by the apparatus.

BRIEF DESCRIPTION OF THE DRAWINGS

FIGS. 1A and 1B are illustrations of an exemplary semiconductor apparatus according to the related art;

FIGS. 6A to 6G are illustrations for explaining an exemplary wire bonding process used in the technique of the present disclosure;

FIGS. 7A to 7D are illustrations for explaining an example of adjustment of the shape of a metal wire bonding portion;

FIGS. 10A and 10B are illustrations of an exemplary case in which a metal wire is also used as a shield member;

FIGS. 11A, 11B, and 11C are illustrations for explaining a first projecting part creating process for forming the shape of a metal wire shown in FIGS. 10A and 10B;

FIGS. 12A, 12B, and 12C are illustrations for explaining a second projecting part creating process for forming the shape of a metal wire shown in FIGS. 10A and 10B;

FIG. 13 is an image showing an exemplary metal wire disposed using a wire bonding process according to the related art;

DETAILED DESCRIPTION

Embodiments of the present disclosure will now be described. The following items will be described in the order listed.

1. First Embodiment (Embodiment Wherein Metal Wires are Disposed in Low Position)
2. Second Embodiment (Embodiment Wherein Metal Wires are Used Also as Shield member) 3. Modification 1. First Embodiment FIGS. 2A to 2C and FIGS. 3D and 3E schematically show a method of manufacturing a semiconductor apparatus in which metal wires are disposed in low positions.

Figure 2A:
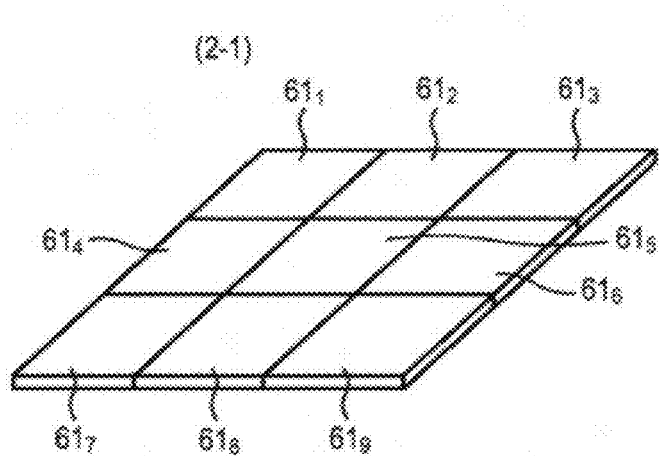
FIGS. 2A, 2B, and 2C are illustrations for schematically explaining a camera module manufacturing process.

According to this manufacturing method, a semiconductor apparatus having metal wires disposed in low positions is manufactured from each of a plurality of printed substrates $61_1$ to $61_9$ as shown in FIG. 2A.

In the following description, the printed substrates $61_1$ to $61_9$ may be simply referred to as "printed substrates $61_n$ (n=1, 2, . . . , 9)" when there is no need for distinguishing the printed substrates from each other.

The plurality of printed substrates $61_1$ to $61_9$ are formed as a single sheet-like member. The number of printed substrates to form such a sheet-like member is not limited to nine, and a sheet-like member may be formed from eight or less printed substrates or ten or more printed substrates.

Figure 2B:
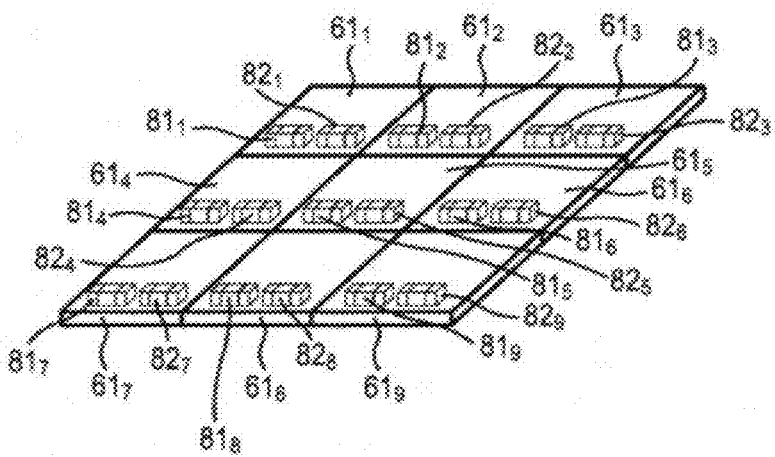

According to the manufacturing method, surface mount components $81_n$ and $82_n$ are disposed on the printed substrates $61_n$. Specifically, as shown in FIG. 2B, surface mount components $81_1$ and $82_1$ are disposed on the printed substrate $61_1$. Surface mount components $81_2$ and $82_2$ are disposed on the printed substrate $61_2$. Surface mount components $81_3$ and $82_3$ are disposed on the printed substrate $61_3$. Surface mount components $81_4$ and $82_4$ are disposed on the printed substrate $61_4$. Surface mount components $81_5$ and $82_5$ are disposed on the printed substrate $61_5$. Surface mount components $81_6$ and $82_6$ are disposed on the printed substrate $61_6$. Surface mount components $81_7$ and $82_7$ are disposed on the printed substrate $61_7$. Surface mount components $81_8$ and $82_8$ are disposed on the printed substrate $61_8$. Surface mount components $81_9$ and $82_9$ are disposed on the printed substrate $61_9$.

The sheet-like member formed by the plurality of printed substrates $61_1$ to $61_9$ is divided (cut) into the plurality of printed substrates $61_1$ to $61_9$. The division of the member is not limited to the timing which comes after the surface mount components $81_n$ and $82_n$ are disposed.

Figure 2C:
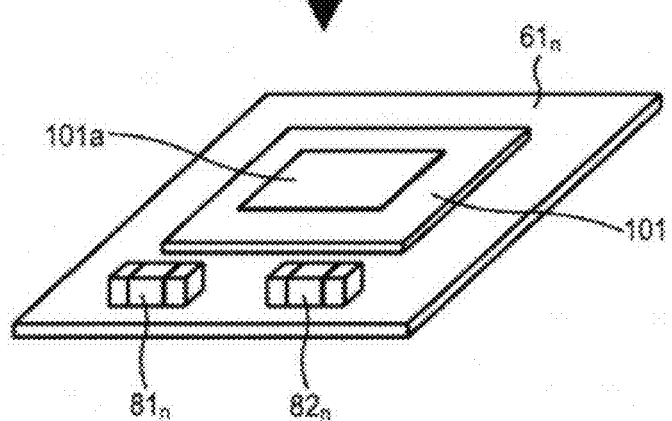

As shown in FIG. 2C, an imaging chip 101 having a light receiving surface 101a of an imaging device is disposed in the middle of each of printed substrates $61_n$ obtained by the dividing process and bonded to the substrate. That is, die bonding is carried out.

Figure 3D:
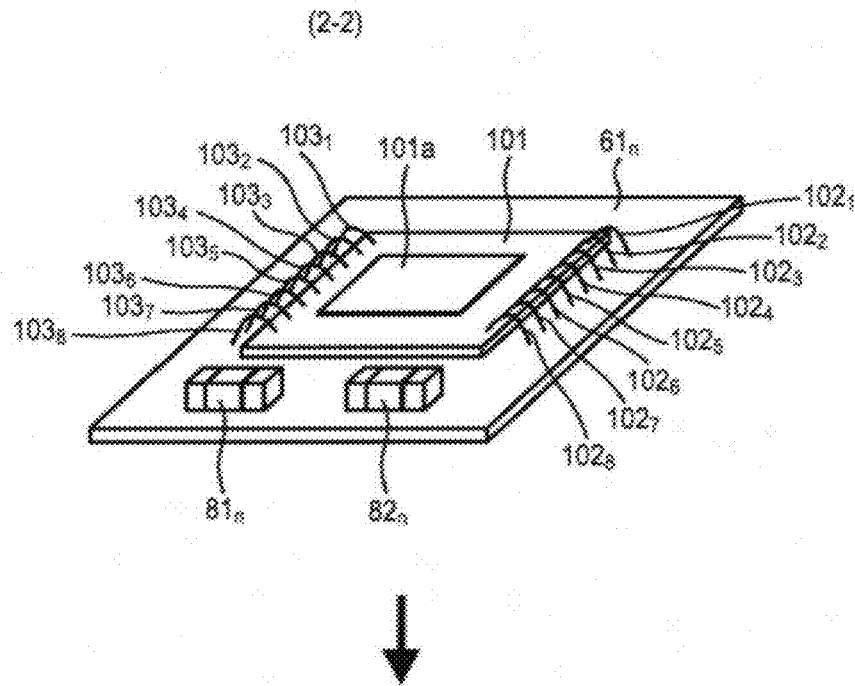
FIGS. 3D and 3E are illustrations for schematically explaining the camera module manufacturing process.

After die bonding is carried out, as shown in FIG. 3D, inner leads (not shown) on each printed substrate 61n and electrode pads (not shown) on the imaging chip 101 are connected through metal wires $102_1$ to $102_8$ and metal wires $103_1$ to $103_8$. That is, wire bonding is carried out. As a result of wire bonding, each of the metal wires $102_1$ to $102_8$ and the metal wires $103_1$ to $103_8$ is disposed in a low position.

Figure 3E:
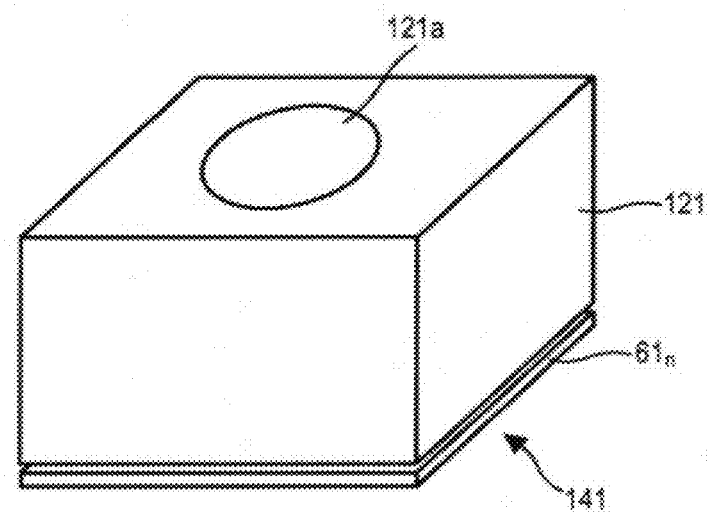

After wire bonding is carried out, as shown in FIG. 3E, a lens unit 121 including a sheet-like member, a lens 121a, and an infrared cutoff filter (not shown) formed so as to cover each printed substrate $61_n$ is disposed on the printed substrate $61_n$. Thus, a camera module 141 that is a semiconductor apparatus is fabricated.

Figure 4:
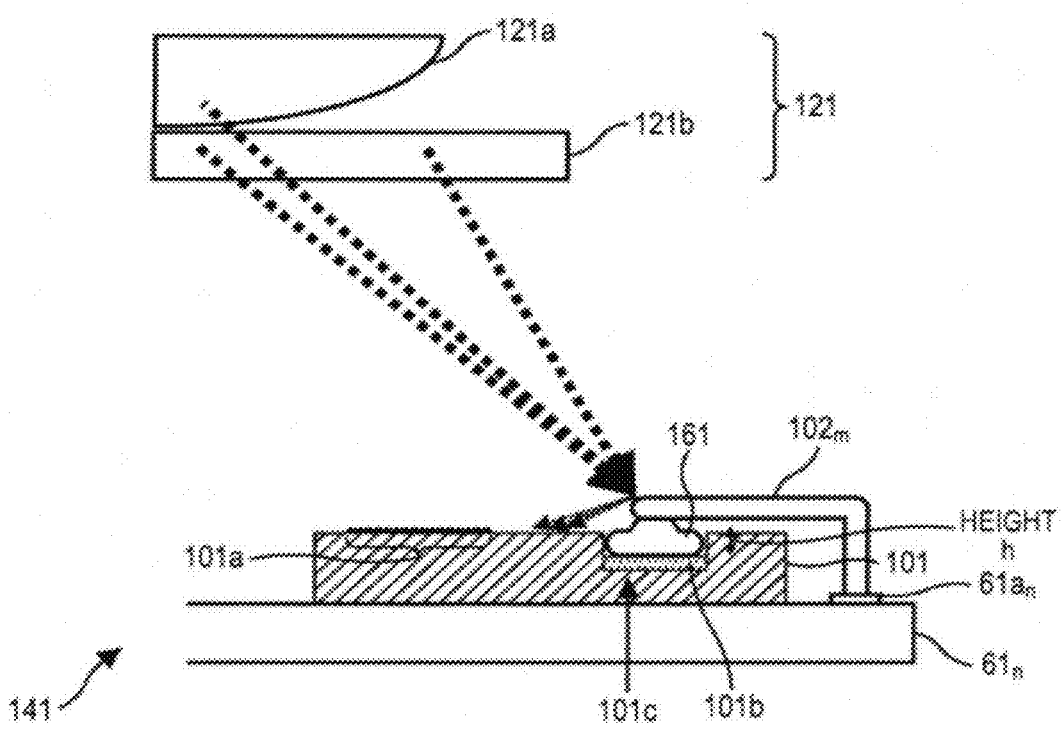
FIG. 4 is an illustration of an exemplary camera module manufactured by the camera module manufacturing process.

FIG. 4 shows an exemplary camera module 141 fabricated according to the above-described manufacturing method.

The camera module 141 has a configuration in which metal wires $102_m$ (m=1, 2, . . . , 8) are disposed in positions at a low elevation above an imaging chip 101 to prevent reflected light beams from the metal wires $102_m$ from impinging on the light receiving surface 101a.

FIG. 4 primarily shows the neighborhood of the metal wires $102_m$ to describe the configuration, and other parts of the module are omitted. The neighborhood of metal wires $103_m$ are also omitted in the illustration because the region is similar in configuration to the neighborhood of the metal wires $102_m$.

The camera module 141 is primarily formed by a printed substrate $61_n$, an imaging chip 101, metal wires $102_m$, a lens unit 121, and metal wire bonding portions 161.

Inner leads $61a_n$ are provided on the printed substrate $61_n$. Each inner lead $61a_n$ is connected to one end of a metal wire $102_m$, and the lead is connected to an electrode pad 101b provided on the bottom of a recess 101c on the imaging chip 101 through the metal wire $102_m$ and a metal wire bonding portion 161.

The imaging chip 101 has a light receiving surface 101a, and the electrode pads 101b are disposed on the bottom of the recesses 101c which are formed on the imaging chip 101.

The metal wires $102_m$ are made of a conductive metal, and each wire is connected to an inner lead $61a_n$ at one end thereof and connected to a metal wire bonding portion 161 at another end thereof. The camera module 141 may alternatively be formed using wires made of a non-metal conductive material instead of the metal wires $102_m$.

The metal wires $102_m$ are disposed such that they extend (substantially) in parallel with the plane of the imaging chip 101 in positions at a low elevation above the imaging chip 101. Specifically, the metal wires $102_m$ are disposed such that they extend in parallel with the plane of the imaging chip 101 in positions, for example, at a distance of about 40 μm from a surface of the imaging chip 101 (a top surface of the chip in the illustration).

The lens unit 121 is primarily formed by a lens 121a and an infrared cutoff filter 121b. A sheet-like member which also forms a part of the lens unit 121 is omitted to avoid complicatedness of illustration.

The metal wire bonding portions 161 are made of a conductive material (which may be, for example, the same material as the metal wires $102_m$), and they are inserted and bonded to the recesses 101c. For example, the metal wire bonding portions 161 are pressed to be bonded with the electrode pads 101b disposed on the bottom of the recesses 101c such that they are disposed at a height h (in the range from 5 to 10 μm) above the electrode pads 101b.

In the camera module 141 shown in FIG. 4, the metal wire bonding portions 161 are forced into the recesses 101c and pressed to be bonded with the electrode pads 101b. Thus, the portions 161 are (substantially entirely) accommodated in a groove which is constituted by the recesses 101c. The metal wires $102_m$ are disposed such that they extend in parallel with the plane of the imaging chip 101 in positions at a low elevation above the imaging chip 101. Thus, the metal wires $102_m$ are disposed in positions at a low elevation above the imaging chip 101.

When compared to the case shown in FIG. 1A, the configuration is advantageous in that reflections of light beams incident on the metal wires $102_m$ and the metal wire bonding portions 161 (represented by arrows in FIG. 4) can be prevented from impinging on the light receiving surface 101a. It is therefore possible to prevent the imaging chip 101 from generating an image of low quality having noises such as flare and ghosts attributable to reflected light beams from the metal wires $102_m$ and the metal wire bonding portions 161.

Further, the electrode pads 101b can be disposed within an effective lens diameter of the lens 101a (within a range of incidence of incident beams projected on the imaging chip 101). Therefore, the electrode pads 101b can be disposed in the vicinity of the light receiving surface 101a which is disposed within the effective lens diameter.

Thus, the imaging chip 101 can be kept small when compared to a case wherein the electrode pads 101b are provided outside the effective lens diameter of the lens 121a. The compactness of the imaging chip 101 allows the printed substrate $61_n$ and the infrared cutoff filter 121b to be made small accordingly, which is significantly advantageous in providing the camera module 141 with a small size.

Since the metal wires $102_m$ of the camera module 141 extend in parallel with the plane of the imaging chip 101, the metal wires 102m can be kept shorter, for example, compared to the length that the wires have in the case shown in FIGS. 1A and 1B. There is no need for providing a shield member 27 as shown in FIG. 1B in the camera module 141. Therefore, the manufacturing cost of the camera module 141 can be kept small.

Referring to FIG. 1B, reflected light beams may not be sufficiently prevented from impinging on the lrs 22a depending on the position where the shield member 27 is disposed. On the contrary, such a situation can be avoided in the case of the camera module 141 because there is no need for providing a shield member 27 in the module.

[Exemplary Manufacturing Apparatus 181 for Manufacturing Camera Module 141]

Figure 5:
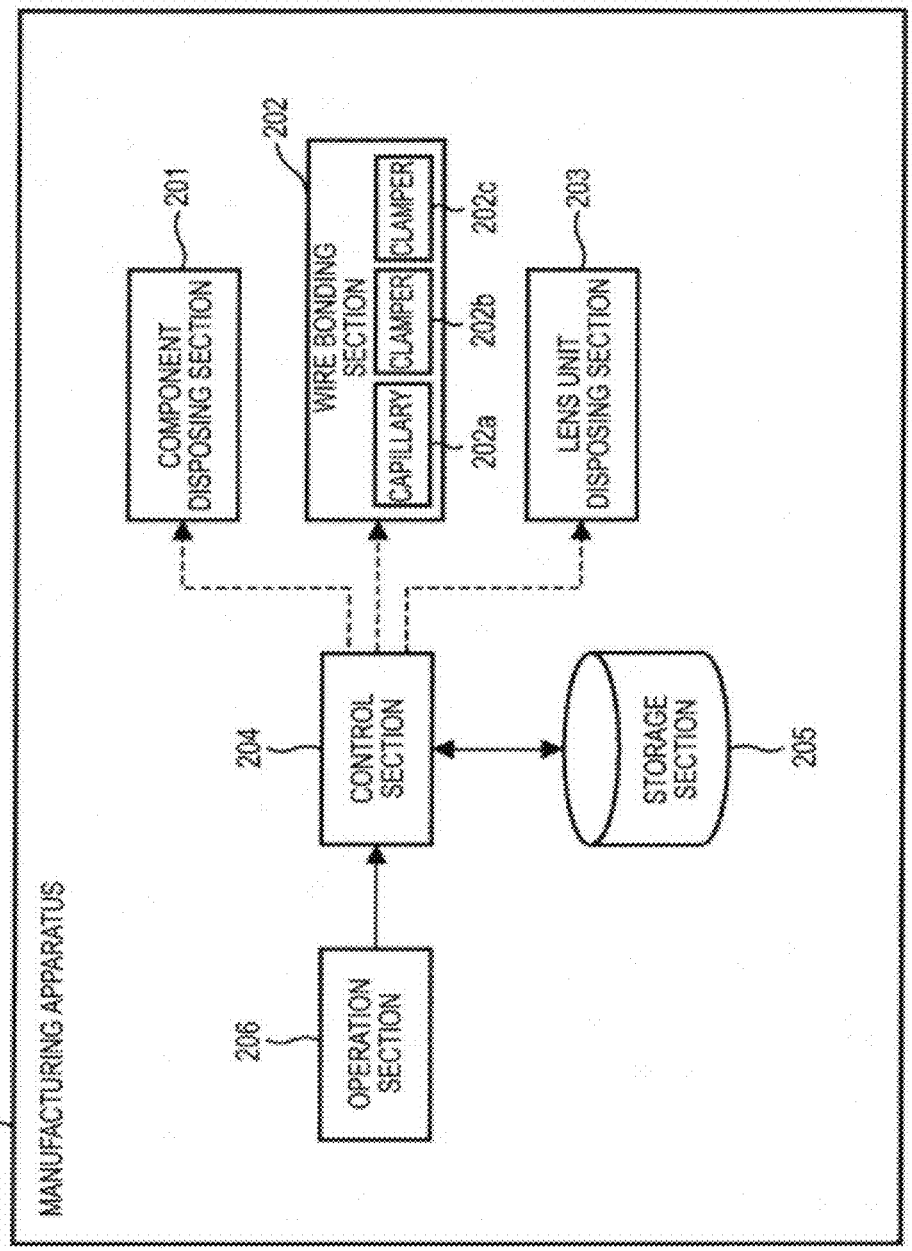
FIG. 5 is a block diagram showing an exemplary configuration of a manufacturing apparatus for manufacturing a camera module.

FIG. 5 shows an exemplary configuration of a manufacturing apparatus 181 for manufacturing camera modules 141.

The manufacturing apparatus 181 includes a component disposing section 201, a wire bonding section 202, a lens unit disposing section 203, a control section 204, a storage section 205, and an operation section 206. In FIG. 5, the arrow represented by a solid line indicates a signal line, and the arrows represented by dotted lines indicate control lines.

The component disposing section 201 disposes surface mount components $81_n$ and $82_n$ on a printed substrate $61_n$ under control exercised by the control section 204. Die bonding of the imaging chip is carried out.

The wire bonding section 202 includes, for example, a capillary 202a, a clamper 202b, and a clamper 202c, and the section performs wire bonding between the printed substrate $61_n$ and an imaging chip 101 under control exercised by the control section 204.

The capillary 202a contain a metal wire $102_m$ therein, and the metal wire $102_m$ is let out from the capillary 202a to perform wire bonding, i.e., connecting an inner lead $61a_n$ on the printed substrate $61_n$ to an electrode pad 101b on the imaging chip 101 through the metal wire $102_m$.

Each of the clampers 202b and 202c secures the metal wire $102_m$ so as to sandwich the wire.

Details of the processes performed by the wire bonding section 202 will be described later with reference to FIGS. 6A to 6G and FIGS. 7A to 7D.

The lens disposing section 203 disposes a lens unit 121 on the printed substrate $61_n$ after the wire bonding is finished.

The control section 204 is constituted by, for example, a CPU (central processing unit), and the control section controls the component disposing section 201, the wire bonding section 202, and the lens unit disposing section 203 according to operation signals supplied from the operation section 206.

The storage section 205 may be, for example, a hard disc or the like in which control programs to be executed by the control section 204 are stored in advance. Data specified by the control section 204 as data to be written are written (stored) in the storage section 205, and data specified to be read are read from the storage section 205. For example, a control program may be updated through a network such as the internet, and a program may alternatively be updated using a recording medium in which a new control program is recorded.

The operation section 206 is constituted by buttons and the like to be operated by an operator. When operated by an operator, the section supplies an operation signal associated with the operation to the control section 204. For example, when an operator performs a user operation for instructing the manufacture of a camera module 141 using the operation section 206, the manufacturing section 181 starts manufacturing a camera module 141 accordingly.

[Details of Wire Bonding Section 202]

FIGS. 6A to 6G show an exemplary wire binding operation performed by the wire bonding section 202.

As described above, the wire bonding section 202 is primarily formed by a capillary 202a, a clamper 202b, and a clamper 202c.

The capillary 202a causes arc discharge at a tip of the metal wire $102_m$ projecting from the bottom thereof to form a metal ball called an FAB (free air ball) at the tip of the wire, the metal ball constituting a spherical metal wire bonding portion 161.

After the spherical metal wire bonding portion 161 is formed, the capillary 202a moves to a position above a recess 101c on the imaging chip 101 as shown in FIG. 6A.

The capillary 202a moves downward toward the recess 101c of the imaging chip 101 to press the metal wire bonding portion 161 to bond it with an electrode pad 101b disposed on the bottom of the recess 101c as shown in FIG. 6B. The operation of pressing and bonding the metal wire bonding portion 161 will be described later with reference to FIGS. 7A to 7D.

After pressing the metal wire bonding portion 161 to bond it with the electrode pad 101b, the capillary 202a moves upward to a predetermined position as shown in FIG. 6C. Thereafter, the clamper 202c secures the metal wire $102_m$ so as to sandwich the metal wire.

As shown in FIG. 6D, the capillary 202a moves from the position on the recess 101c of the imaging chip 101 to a position above an inner lead $61a_n$ of the printed substrate $61_n$ with the metal wire $102_m$ secured by the clamper 202c.

Thereafter, the clamper 202c stops securing the metal wires $102_m$, and the capillary 202a moves downward from the inner lead $61a_n$ of the printed substrate $61_n$, whereby the metal wire $102_m$ projecting from the tip of the capillary 202a is pressed to be bonded with the inner lead $61a_n$. Thereafter, the capillary 202a moves (vibrates) to the left and right in the figures, whereby the metal wire $102_m$ is cut by the tip part of the capillary 202a.

As a result, the metal wire $102_m$ is divided into a part of the metal wire $102_m$ which extends inside the capillary 202a and another part of the metal wire $102_m$ which serves as a bonding wire bonding the imaging chip 101 and the printed substrate $61_n$.

The part of the metal wire $102_m$ serving as a bonding wire is pressed by a flat collet or the like (not shown) to shape the metal wire $102_m$ such that it extends in parallel with the plane of the imaging chip 101 at a height of about 40 μm from a surface of the imaging chip 101.

Thereafter, the clamper 202b secures the part of the metal wire 102m extending in the capillary 202a by sandwiching it.

Then, the capillary 202a moves upward to a predetermined position as shown in FIG. 6F.

Thereafter, as shown in FIG. 6G, a spherical metal wire bonding portion 161 is formed at the tip of metal wire $102_m$ projecting from the bottom of the capillary 202a by, for example, causing arc discharge at the tip. After the spherical metal wire bonding portion 161 is formed, the capillary 202a moves to a position above another recess 101c formed on the imaging chip 101 as shown in FIG. 6A, and wire bonding is thereafter similarly repeated.

In FIGS. 6A to 6G, the metal wire $102_m$ serving as a bonding wire is pressed by a flat collet or the like which is not shown to shape the wire such that it extends in parallel with the plane of the imaging chip 101 at a distance of about 40 μm from a surface of the imaging chip 101.

For example, the metal wire $102_m$ may alternatively be disposed by the capillary 202a such that the wire extends in parallel with the plane of the imaging chip 101 at a distance of about 40 μm from a surface of the imaging chip 101 as shown in FIGS. 6C to 6E. Operations of the manufacturing apparatus 181 performed in such a case will be described later with reference to the flow chart shown in FIGS. 8 and 9.

FIGS. 7A to 7D show an example in which the capillary 202a presses a spherical metal wire bonding portion 161 to bond it with an electrode pad 101b in a recess 101c, thereby accommodating the bonding portion in the recess 101c as shown in FIG. 6B.

The capillary 202a moves down from above the recess 101c of the imaging chip 101 toward the electrode pad 101b in the recess 101c. For example, the capillary 202a starts moving in a position as shown in FIG. 7A, moves downward as shown in FIGS. 7B and C, and finally reaches a position as shown in FIG. 7D.

In the position shown in FIG. 7D, the capillary 202a minutely moves (vibrates) to the left and right in the figure (in directions parallel to the surface of the electrode pad 101b) to form the metal wire bonding portion 161 into a shape such that it is accommodated in the recess 101c.

[Description of Operations of Manufacturing Apparatus 181]

Figure 8:
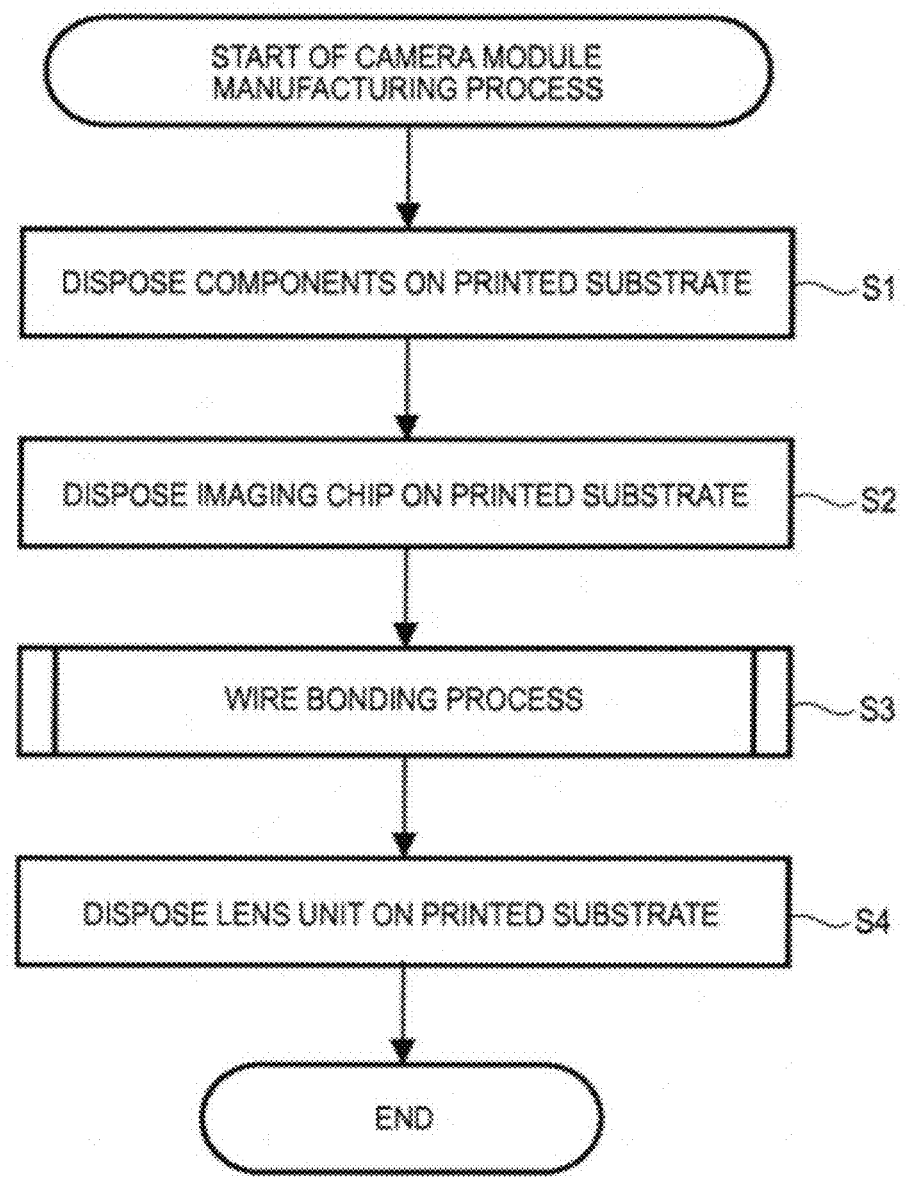
FIG. 8 is a flow chart for explaining an exemplary camera module manufacturing process performed by a manufacturing apparatus.

An exemplary camera module manufacturing process performed by the manufacturing apparatus 181 will now be described with reference to the flow chart shown in FIG. 8.

For example, the camera module manufacturing process is started when an operator performs an instructing operation for instructing the manufacturing apparatus 181 to manufacture a camera module 141 using the operation section 206 of the apparatus 181. At this time, the operation section 206 supplies an operation signal associated with the instructing operation of the operator to the control section 204. Based on the operation signal from the operation section 206, the control section 204 controls the component disposing section 201, the wire bonding section 202, and the lens unit disposing section 203 to manufacture a camera module 141.

Specifically, at step S1, the component disposing section 201 disposes surface mount components $81_n$ and $82_n$ on printed substrates 61n under control exercised by the control section 204. The component disposing section 201 divides the printed substrates $61_n$ forming a single sheet-like member into individual printed substrates $61_n$. At step S2, the components disposing section 201 performs die bonding of imaging chips under control exercised by the control section 204.

At step S3, the wire bonding section 202 performs a wire bonding process for connecting each printed substrate $61_n$ and an imaging chip 101 under control exercised by the control section 204. The wire bonding process will be described later with reference to FIG. 9.

At step S4, the lens unit disposing section 203 disposes a lens unit 121 on each printed substrate $61_n$ which has been subjected to the wire bonding process, whereby the camera module manufacturing process is terminated.

[Details of Wire Bonding Process]

Figure 9:
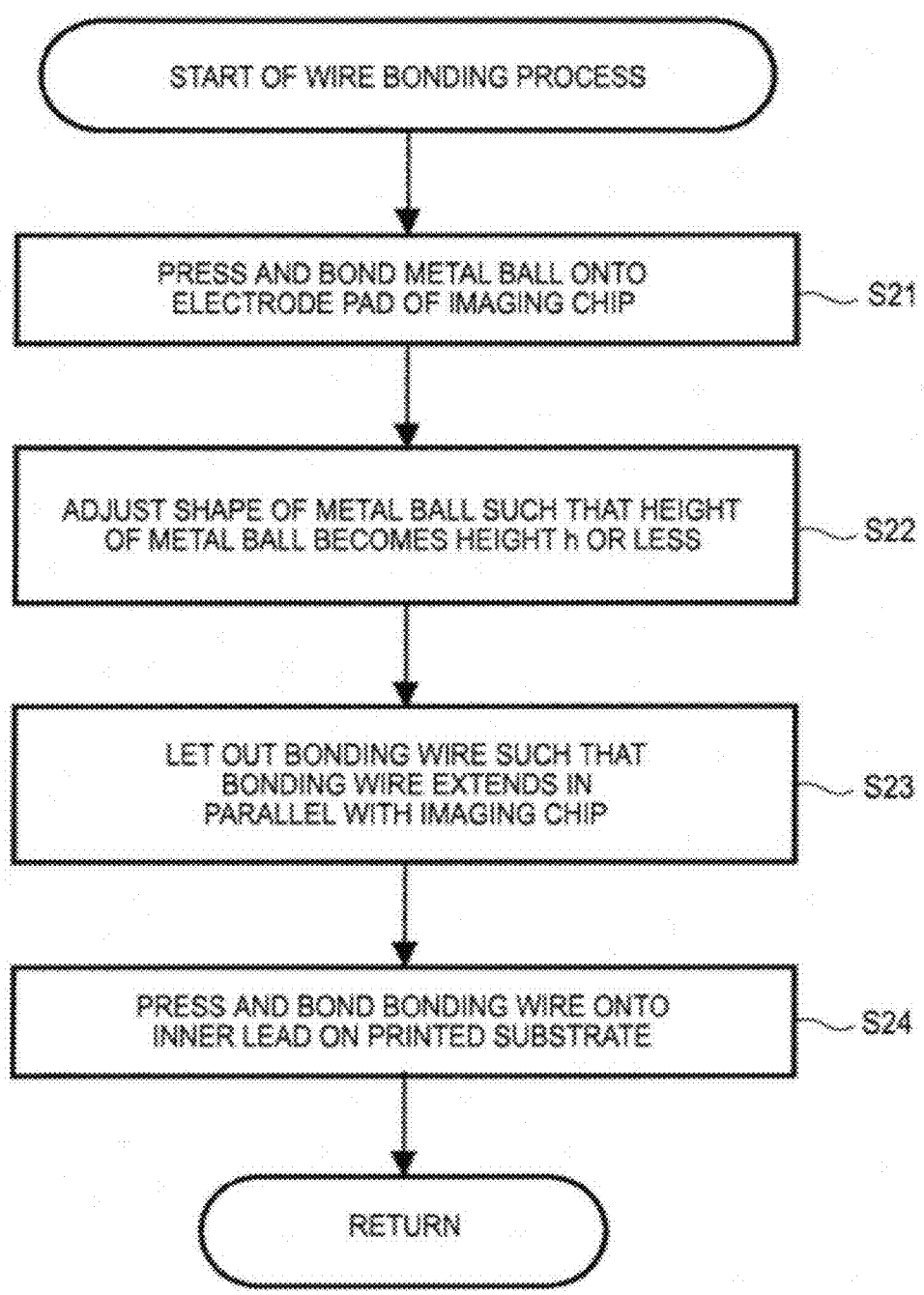
FIG. 9 is a flow chart for explaining an exemplary wire bonding process performed by a wire binding section.

Details of the wire bonding process at step S3 shown in FIG. 8 will now be described with reference to the flow chart in FIG. 9.

At step S21, the capillary 202a of the wire bonding section 202 forms a metal ball referred to as "FAB" or a spherical metal wire bonding portion 161 at a tip of a metal wire $102_m$ projecting from the bottom of the capillary 202a, for example, by causing arc discharge at the tip.

The capillary 202a moves to a position above a recess 101c on the imaging chip 101, and the capillary moves down into the recess 101c of the imaging chip 101 to press the metal wire bonding portion 161 and bond it with an electrode pad 101b disposed on the bottom of the recess 101c.

At step S22, the capillary 202a forms the metal wire bonding portion 161 into such a shape that the portion can be accommodated in the recess 101c while pressing the metal wire bonding portion 161 to bond it with the electrode pad 101b. Thus, the metal wire bonding portion 161 is formed, for example, such that the height (thickness) of the metal wire bonding portion 161 becomes a height h or less.

At step S23, the capillary 202a moves from the recess 101c of the imaging chip 101 to a position above an inner lead $61a_n$ of the printed substrate $61_n$ while letting out the metal wire $102_m$ with the height of the wire kept at, for example, about 40 µm from the imaging chip 101. Thus, the metal wire $102_m$ is disposed such that it extends in parallel with the plane of the imaging chip 101 at a height of about 40 µm above the imaging chip 101.

At step S24, the capillary 202a moves downward from the position above the inner lead $61a_n$ on the printed substrate $61_n$, whereby the metal wire $102m$ projecting from the tip of the capillary 202a is pressed to be bonded with the inner lead $61a_n$.

The capillary 202a repeats the processes at steps S21 to S24 to shape a plurality of metal wires $102_1$ to $102_8$ and metal wires $103_1$ to $103_8$ into bonding wires as shown in FIG. 3E. Thereafter, the process returns to step S3 shown in FIG. 8 and then proceeds to step S4 to fabricate a camera module 141 from each printed substrate $61_n$ which has been subjected to the wire bonding process.

As described above, the camera module manufacturing process allows the manufacture of a camera module 141, for example, as shown in FIG. 4.

According to the first embodiment of the present disclosure, a metal wire bonding portion 161 is accommodated in a recess 101a on an imaging chip 101 to keep a part of the metal wire bonding portion 161 exposed on the imaging chip 101 small, whereby a reflected light beam from the metal wire bonding portion 161 is less likely to impinge on a light receiving surface 101a.

A relatively great part of the metal wire bonding portion 161 is exposed on the imaging chip 101 when an electrode pad 101b is disposed on the surface of the imaging chip 101 without a recess 101a on the imaging chip 101 or when the depth of the recess 101a of the imaging chip 101 (the height h) is relatively small.

In such a case, a reflected light beam from the metal wire bonding portion 161 can impinge on the light receiving surface 101a.

Under the circumstance, for example, a metal wire $102_m$ serving as a bonding wire may be projected toward the light receiving surface 101a. Thus, a shield member can be formed from the metal wire $102_m$ to prevent a reflected light beam from a metal wire bonding portion 161 from impinging on the light receiving surface 101a.

2. Second Embodiment

A description will now be made with reference to FIGS. 10A to 12C on an exemplary case in which a shield member is formed from a metal wire $102_m$ serving as a bonding wire by projecting the wire toward the light receiving surface 101a.

FIGS. 10A and 10B show the exemplary case in which a shield member is formed from a metal wire $102_m$ serving as a bonding wire by projecting the wire toward the light receiving surface 101a.

FIG. 10A is a side view of a metal wire $102_m$ and a metal wire bonding portion 161, and 10B is a plan view of the features.

In the side view shown in FIG. 10A, the metal wire $102_m$ is formed with a projecting part having a length L which projects toward a light receiving surface 101a. Thus, incident light beams 41a to 41c are reflected in a direction different from the direction in which the light receiving surface 101a is located.

The projecting part having a length L serves as a shield member shielding a side surface of the metal wire bonding portion 161 (the surface on the left in the illustration) from the incident light beam 41a, whereby a shielded area is formed on the side of the metal wire bonding portion 161. The incident light beam 41a does not impinge on the side surface of the metal wire bonding portion 161 as thus described. Thus, reflection of the incident light beam 41a does not take place on the side surface of the metal wire bonding portion 161, and the light beam is not received by the light receiving surface 101a.

For example, the length L is such a length that an incident light beam 211 entering through a lens 121a and an infrared cutoff filter 121b will not be blocked by the projecting part. The incident light beam 211 impinges on a bottom end of the side surface of the metal wire bonding portion 161, as shown in FIG. 10A.

For example, the length L is determined according to a distance D between the metal wire $102_m$ and the imaging chip 101. The length L can be made shorter, the shorter the distance D. Referring to FIGS. 10A and 10B, it is assumed that no step is formed between surfaces of the imaging chip 101 and the electrode pad 101b. Therefore, the distance D between the metal wire $102_m$ and the electrode pad 101b is equal to the distance between the metal wire $102_m$ and the imaging chip 101.

When a recess 101c is formed on the imaging chip 101 and the electrode pad 101b is provided on the bottom of the recess 101c, the distance D is the distance between the metal wire $102_m$ and the imaging chip 101 rather than the distance between the metal wire $102_m$ and the electrode pad 101b.

That is, the distance D is the height of a part of the metal wire bonding portion 161 exposed above the imaging chip 101.

Referring to the plan view shown in FIG. 10B, each of reflected light beams $41b_1$ to $41b_4$, i.e. light beams reflected by the metal wire bonding portion 161 after impinging thereon may travel toward the light receiving surface 101a (to the left in the figure). The reflected light beams $41b_1$ to $41b_4$ are more likely to impinge on the light receiving surface 101a, the greater the distance D that is the height of apart of the metal wire bonding portion 161 exposed above the imaging chip 101.

It is therefore desirable to keep the reflected light beams $41b_1$ to $41b_4$ less likely to impinge on the light receiving surface 101a by keeping the distance D small.

An exemplary process of creating a projecting part of a metal wire 102m will now be described with reference to FIGS. 11A, 11B, and 11C and FIGS. 12A, 12B, and 12C.

FIGS. 11A, 11B, and 11C show a first projecting part creating process performed by a capillary 202a. The first projecting part creating process is performed instead of the process at step S23.

The capillary 202a presses a metal wire bonding portion 161 to bond it with an electrode pad 101b as shown in FIG. 11A and thereafter moves upward to a predetermined position. As shown in FIG. 11B, the capillary 202a moves toward the light receiving surface 101a (to the left in the figure).

As shown in FIG. 11C, the capillary 202a moves downward to a position at a distance of about 40 μm from the surface of the imaging chip 101 while moving in the opposite direction of the light receiving surface 101a (to the right in the figure). After moving downward, the capillary 202a moves in the opposite direction of the light receiving surface 101a while staying at the height of about 40 μm from the surface of the imaging chip 101, whereby a projecting part of the metal wire $102_m$ is created.

FIGS. 12A, 12B, and 12C show a second projecting part creating process in which a projecting part of a metal wire $102_m$ serving as a bonding wire is created by pressing the wire from above using a flat collet.

The second projecting part creating process is performed instead of steps S23 and S24 of the wire bonding process described above with reference to FIG. 9.

For example, the capillary 202a of the wire bonding section 202 performs wire bonding such that a gap is formed between an imaging chip 101 and a metal wire $102_m$ as shown in FIG. 12A.

A flat collet 221 presses the metal wire $102_m$ from above after wire bonding is performed as shown in FIG. 12B, whereby the metal wirer 102m is shaped as shown in FIG. 12C.

In the first embodiment of the present disclosure, wire bonding is carried out by bonding the metal wire $102_m$ onto the electrode pad 101b of an imaging chip 101 and thereafter bonding the wire to the inner lead $61a_n$ of the printed substrate $61_n$. The wire bonding may be carried out with the order of the bonding operations reversed.

In this case, a stud bump having a height similar to the height h of the recess 101c is formed on the electrode pad 101b of the imaging chip 101 according to the first embodiment of the present disclosure. After the metal wire 102m is pressed to be bonded with the inner lead $61a_n$, the wire is disposed such that it extends in parallel with the plane of the imaging chip 101 at a distance of about 40 μm from the surface of the imaging chip 101. Thus, the wire is pressed to be bonded with the stud bump formed on the electrode pad 101b. This equally applies to the second embodiment.

In the second embodiment, for example, after the metal wire 102m is pressed to be bonded with the inner lead 61an and then onto a stud bump, a projecting part is created from the stud bump instead of the metal wire bonding portion 161 as described above with reference to FIGS. 11A, 11B, and 11C. Alternatively, a projecting part may be created before pressing the wire to bind it with the stud bump.

In the first embodiment, after the metal wire 102m is pressed to be bonded with the inner lead 61an and then to be bonded with the stud bump, the wire may be shaped by pressing it with a flat collet or the like such that the wire extends in parallel with the plane of the imaging chip at a distance of about 40 μm from the surface of the imaging chip 101. This equally applies to the second embodiment.

Figure 14:
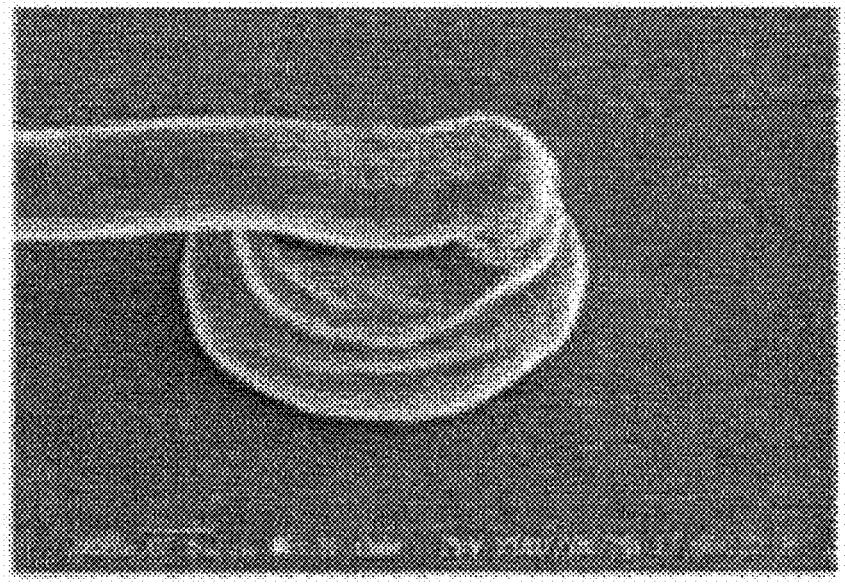
FIG. 14 is an image showing an exemplary metal wire disposed using a technique according to an embodiment of the present disclosure.
Figure 15:
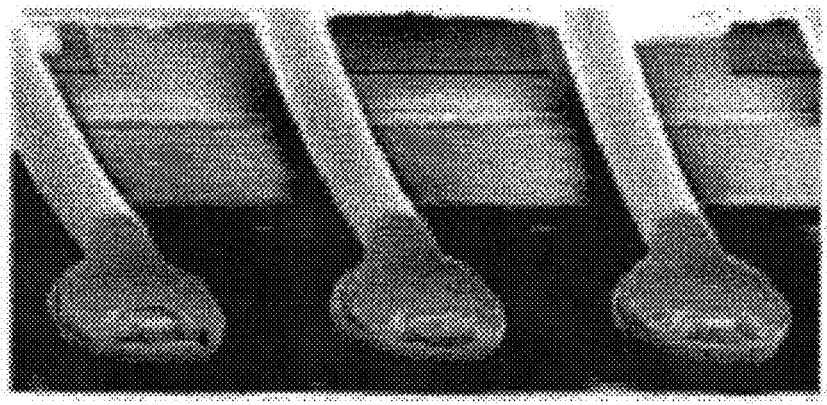
FIG. 15 is an image showing another exemplary metal wire disposed using a technique according to an embodiment of the present disclosure.

A comparison will now be carried out with reference to FIGS. 13 to 15 between a bonding wire formed using a wire bonding process according to the related art and a bonding wire formed using the wire bonding process described above as the first embodiment of the present disclosure.

FIG. 13 shows an exemplary bonding wire formed by a wire bonding process according to the related art. The bonding wire shown in FIG. 13 is disposed in a relatively high position.

FIG. 14 shows an exemplary bonding wire formed by the wire bonding process performed by the manufacturing apparatus 181. FIG. 15 shows exemplary results of wire bonding carried out by the manufacturing apparatus 181 with the order of bonding operations reversed.

FIGS. 14 and 15 show that the bonding wire is disposed in a relatively low position.

3. Modifications

In the first and second embodiments of the present disclosure, the metal wire $102_m$ and the metal wire bonding portion 161 are disposed in low positions to prevent light beams reflected by those features from impinging on the light receiving surface 101a. Further, those features may be coated with a reflection-reducing coating material in black.

In this case, the reflectivity of the metal wire $102_m$ and the metal wire bonding portion 161 can be reduced. Therefore, even if reflected light beams from the metal wire $102_m$ and the metal wire bonding portion 161 are received by the light receiving surface 101a, noises such as flare and ghosts can be kept less significant when compared to noises encountered without a reflection-reducing coating material.

For example, a UV ink which is cured when irradiated with ultraviolet light may be used as the reflection-reducing coating material, and such a material may be applied to the features using an inkjet printing process. For example, the application of the reflection-reducing coating material using inkjet printing may be performed at timing which comes after wire bonding is carried out.

The reflection-reducing coating material is preferably applied to the metal wire $102_m$ and the metal wire binding portion 161 only in parts thereof which are illuminated by incident light. However, the metal wire $102_m$ and the metal wire binding portion 161 may be entirely coated with such a material.

The reflection-reducing coating material may be applied to at least either the metal wire $102_m$ or the metal wire bonding portion 161.

The steps described above as a series of processes according to the present disclosure may obviously be performed in a time-sequential manner in the order the steps are described. It is not essential that the steps are performed in a time-sequential manner, and they may be performed in parallel or independently of each other.

The present disclosure is not limited to the above-described first and second embodiments, and various modifications may be made without departing the spirit of the present disclosure.

The present disclosure contains subject matter related to that disclosed in Japanese Priority Patent Application JP 2011-033688 filed in the Japan Patent Office on Feb. 18, 2011, the entire contents of which are hereby incorporated by reference.

What is claimed is:

1. A semiconductor apparatus comprising:
   a first sheet-like member having a light receiving surface of an imaging device and a first connection terminal disposed thereon, the imaging device generating an image by receiving incident light from a light collecting section for collecting external light disposed thereon;
   a second sheet-like member having a second connection terminal to be connected to the first connection terminal provided thereon;
   a conductive bonding portion made of a conductive material and bonded with the first connection terminal; and
   a bonding wire connecting the conductive bonding portion and the second connection terminal, wherein
   the bonding wire is disposed along the plane of the first sheet-like member such that reflected light from the bonding wire does not impinge on the light receiving surface.

2. The semiconductor apparatus according to claim 1, wherein
   the first connection terminal is disposed on the bottom of a recess formed on the side of the first sheet-like member on which the light receiving surface is disposed; and
   the conductive bonding portion is pressed into a groove formed by the recess and bonded to the first connection terminal.

3. The semiconductor apparatus according to claim 1, wherein
   the bonding wire is formed with a projecting part projecting from the conductive bonding portion toward the light receiving surface to shield the conductive bonding portion from incident light coming from the light collection section.

4. The semiconductor apparatus according to claim 3, wherein the projecting part of the bonding wire is formed with a length determined based on the distance from the connection between the bonding wire and the conductive bonding portion to the first sheet-like member to shield the conductive bonding portion from incident light coming from the light collection section.

5. The semiconductor apparatus according to claim 1, wherein the conductive bonding portion is either a stud bump or a metal ball formed by spherically shaping a tip part of the bonding wire.

* * * * *